(12) United States Patent
Lärmer et al.

(10) Patent No.: US 7,262,071 B2
(45) Date of Patent: Aug. 28, 2007

(54) MICROMECHANICAL COMPONENT AND SUITABLE METHOD FOR ITS MANUFACTURE

(75) Inventors: Franz Lärmer, Weil der Stadt (DE); Silvia Kronmüller, Schwaikheim (DE); Christina Leinenbach, Ensdorf (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/343,613

(22) Filed: Jan. 30, 2006

(65) Prior Publication Data
US 2006/0170012 A1 Aug. 3, 2006

(30) Foreign Application Priority Data
Feb. 3, 2005 (DE) .................. 10 2005 004 878

(51) Int. Cl.
*H01L 21/00* (2006.01)

(52) U.S. Cl. .................. 438/53; 438/50; 438/694; 257/252; 257/414

(58) Field of Classification Search .................. 438/53, 438/50, 694; 257/252, 414
See application file for complete search history.

(56) References Cited

U.S. PATENT DOCUMENTS

| 6,204,080 B1 * | 3/2001 | Hwang ..................... 438/29 |
| 6,210,988 B1 * | 4/2001 | Howe et al. .................. 438/50 |
| 2002/0006682 A1 * | 1/2002 | Benzel et al. ................. 438/50 |

FOREIGN PATENT DOCUMENTS

DE    42 41 045    5/1994

* cited by examiner

*Primary Examiner*—Michelle Estrada
*Assistant Examiner*—Nicholas J. Tobergte
(74) *Attorney, Agent, or Firm*—Kenyon & Kenyon LLP

(57) ABSTRACT

A micromechanical component having a substrate conductive in at least some regions; an elastically deflectable diaphragm, which is conductive in at least some regions, arches over a front side of the substrate, and is electrically insulated from the substrate, the diaphragm having an inner region (I; I') and an edge region (RB; RB'); and a hollow space (H), which is provided between the substrate (1) and the diaphragm (M); the inner region (I; I') having a cross-section that is modified in comparison with the edge region (RB; RB'), which means that the bending of the inner region (I; I') is less than that in the case of an identical cross-section.

15 Claims, 9 Drawing Sheets

MICROMECHANICAL COMPONENT AND SUITABLE METHOD FOR ITS MANUFACTURE

FIELD OF THE INVENTION

The invention relates to a micromechanical component and to a corresponding manufacturing method.

DESCRIPTION OF RELATED ART

Although applicable, in principle, to a multitude of micromechanical components, the present invention, as well as the problem forming the basis of it, are explained on the basis of capacitive pressure sensors.

The starting point for explaining the underlying problem is a capacitive pressure sensor, e.g. a relative pressure sensor, in which the capacitance of an upper diaphragm with respect to a counterplate formed by the substrate or in another manner, e.g. in the form of a lower polysilicon electrode, is evaluated in the form of a pair of electrodes. The deflection of the center of a diaphragm fixed on all sides is known to be linearly proportional to the applied pressure or the pressure difference over a wide range. The capacitance of the capacitor formed by the diaphragm and counterelectrode is a reciprocal function of the plate distance, which means that there is primarily a reverse-proportional relationship between the applied pressure or pressure difference and the measured capacitance. If the reciprocal of the capacitance is evaluated as a measured variable, then a signal proportional to the applied pressure is obtained.

Since in the case of such pressure sensors, the diaphragm deflection in the center of the diaphragm is proportional to the pressure, there is, in these variants, a nearly linear characteristic as a first approximation, when the reciprocal capacitance is evaluated. Such an evaluation is obtained, for example, in a capacitance-frequency conversion (C/f converter), where the output frequency of a suitable electronic oscillator circuit having the measuring element as a frequency-determining component of the feedback circuit is proportional to the reciprocal capacitance in a manner known per se. Other circuit switching principles also known per se, such as the switched-capacitor principle or discrete-time principles, can evaluate the voltage produced during the transmission of a fixed charge to the measuring cell and obtain, in this manner, the desired proportionality. An additional, continuous option is to impress a constant alternating current upon the measured capacitance and to ascertain the AC voltage resulting from it. In practice, many switching principles known per se are capable of generating an output voltage from the known sensor elements that is approximately proportional to the pressure.

In these devices, however, the measured capacitance or the change in the measured capacitance is not only produced by the actual center of the diaphragm, but over the entire dimension of the diaphragm, where it always stands opposite to a lower counterplate. In order to provide a sufficient measured capacitance, this counterplate is not just limited to the immediate vicinity of the center of the diaphragm, but rather a certain surface is provided, over which the measured signal is generated. The larger the selected surface, the larger the base capacitance and the capacitance variation of the measuring device, but also the more extended the diaphragm region that contributes to generating the measured signal.

Since the cross-section of the diaphragm as a whole follows a curved bending line in response to the application of pressure, curved regions of the diaphragm outside of its center or center region contribute more and more to the generation of the measured signal, which results in nonlinearity, i.e. a curve of the reciprocal capacitance that no longer runs proportionally to the pressure. This nonlinearity increases with the diaphragm surface outside of the diaphragm center, that is used to generate the measured signal, and correspondingly decreases with the diaphragm surface area outside of the diaphragm center that contributes to the generation of the measured signal. Therefore, from the standpoint of a possible, linear sensor behavior, an evaluation should be pursued, which narrowly limits the evaluation to the region of the diaphragm center itself with the aid of a counterelectrode surface area that is narrowly limited. This requirement is in contradiction to the requirement of a sufficient measuring capacitance for electronic signal processing, a sufficient measuring capacitance requiring large capacitor surfaces. This means that an implementable solution according to the earlier approaches always represents a compromise between a sufficient measured capacitance, i.e. evaluation of a sufficiently large diaphragm surface around the center of the diaphragm, and a still tolerable nonlinearity (or nonlinearity still capable of being compensated for) that is automatically associated with this. The correction of nonlinearity is a complicated method, since in this method, a correction data set, via which numerical linearization of the data supplied by the sensor is subsequently possible and implementable, must be stored for each sensor element. Thus, nonlinear behavior has been considered to be, to date, the main disadvantage of capacitive relative-pressure sensors.

SUMMARY OF THE INVENTION

The invention provides a micromechanical component comprising: a substrate (1), of which at least some regions are conductive; an elastically deflectable diaphragm (M), of which at least some sections are conductive, and which arches over a front side (V) of the substrate (1) and is electrically insulated from the substrate (1), the diaphragm (M) having an inner region (I; I') and an edge region (RB; RB'); and a hollow space (H), which is provided between the substrate (1) and the diaphragm (M); the inner region (I; I') having a cross-section that is modified in comparison with the edge region (RB; RB'), which means that the bending of the inner region (I; I') is less than that in the case of an identical cross-sectional area. The micromechanical component of the invention and the manufacturing method according to the invention have the advantage, that they provide a simple and reliable process for manufacturing micromechanical components, in particular capacitive pressure sensors, which may be implemented in a particularly cost-effective manner. The present invention renders possible, in particular, a capacitive relative-pressure sensor, which has a markedly improved linear behavior due to the manner of manufacturing according to the present invention.

The idea forming the basis of the present invention is that the cross section or layer thickness of some regions of the diaphragm is modulated, i.e. a more complex diaphragm structure is provided, which includes sections that take part less or do not take part at all in the deflection. Critical process steps are avoided to the greatest possible extent, as well as exotic process steps, such as pasting wafers onto substrate wafers, or the like. The core part of the process is trench-etching from the back side of the wafer, in conjunction with subsequent sacrificial-layer etching under the future diaphragm, the sacrificial-layer etching having an extremely high selectivity. Without further measures to protect the surrounding silicon, this very high selectivity allows the sacrificial-layer etching technique to be implemented without attacking the existing silicon structures, which markedly simplifies the entire process again.

The process sequence of the present invention is IC-process-compatible without limitation, which means that an electrical evaluation circuit for signal conversion and signal processing may also be integrated on the front side of the wafer, where it is useful for the intended application.

This is so, because all of the micropatterning processes used, with the exception of HF-vapor etching, are in general completely compatible with integrated circuits likewise present on the wafer. Since the optional HF-vapor etching takes place from the back side of the wafer, it does not reach the sensitive patterns of the front side of the wafer, when the process technology provides for a wafer back side/wafer front side media separation, e.g. using, during the HF-vapor etching, a suitable wafer fixture having o-ring seals towards the front side of the wafer and/or the back side of the wafer. Technical design approaches which can ensure these media separations are well-known, i.e. familiar to one skilled in the art of HF-vapor etching technology and skilled with the corresponding etching apparatuses. Where HF-vapor etching attacks from the front side, namely in the case of absolute-pressure sensor variants processed exclusively from the front side of the wafer, the required process times with HF vapor are so short during the removal of thin oxides in the diaphragm region, that other functional oxides are not damaged or are only slightly damaged by the action of the HF vapor.

According to a preferred further refinement, the inner region is thickened with respect to the edge region.

A further preferred refinement provides for the inner region to have an additional layer in comparison with the edge region.

According to a further preferred refinement, the inner region has, in comparison with the edge region, a region hanging down into the hollow space in the shape of a piston.

A further preferred refinement provides for the hollow space to be filled with a medium, one or more perforation openings running under the diaphragm through the substrate being provided, and the perforation opening(s) providing access to the hollow space from a back side of the substrate, so that a volume of the medium present in the hollow space is variable in response to a deflection of the diaphragm.

BRIEF DESCRIPTION OF THE DRAWINGS

The present invention will be described in greater detail with reference to the following drawings wherein.

In the figures, components that are identical or functionally equivalent are denoted by the same reference numerals.

DETAILED DESCRIPTION OF THE INVENTION

FIGS. 1A-L show schematic cross-sectional views of the essential manufacturing steps of a micromechanical component in the form of a capacitive pressure sensor, according to a first specific embodiment of the present invention.

The idea forming the basis of the first specific embodiment is to overcome the effect of curved diaphragm parts on the measured capacitance and, therefore, to overcome the nonlinearity of the sensor elements, by reducing or completely suppressing the curvature of the diaphragm electrode in the region where measured capacitance is generated, i.e. where the measured signal is generated in conjunction with a lower counterelectrode.

In the first specific embodiment, an inner part of the diaphragm is stiffened by building it up, so that the curvature is reduced for a large part of the surface that contributes to the generation of the measured signal. However, the outer parts of the diaphragm (the edge region) are not built up, which means that the curvature remains limited to the narrow edge region which only contributes to the total capacitance to a small degree.

Figure 1A:
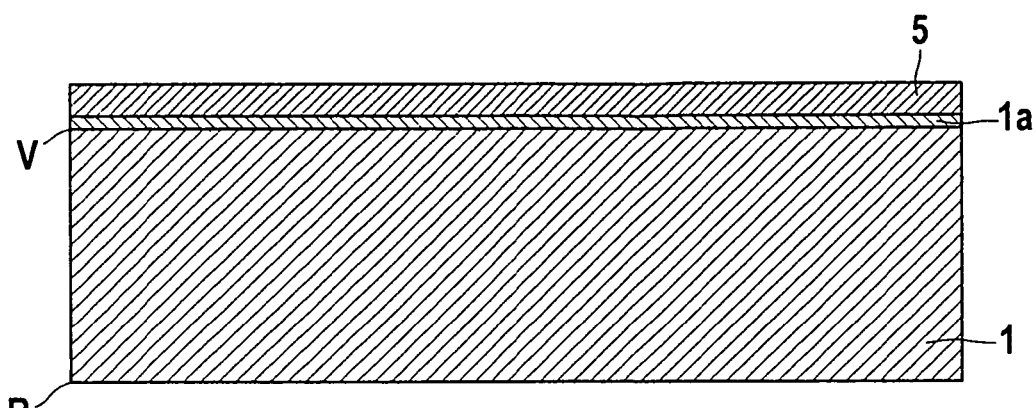
FIGS. 1A-L show schematic cross-sectional views of the essential manufacturing steps of a micromechanical component in the form of a capacitive pressure sensor.

FIG. 1A shows a silicon-wafer substrate 1 having a silicon-oxide layer 1a provided on front side V of the wafer and a superjacent sacrificial layer 5 of SiGe, preferably $Si_{1-x}Ge_x$ where x=0.1-0.8, especially 0.2-0.5. According to FIG. 1B, sacrificial layer 5 is oxidized in a subsequent process step to form a SiGe oxide layer 5 over it. This oxide layer is later used as an etching stop and also as a diffusion barrier for Ge, in order to prevent Ge atoms from diffusing out into the adjacent polysilicon material in subsequent high-temperature processing steps; such an interdiffusion of Ge would likewise convert the adjacent, functional silicon into SiGe and reduce the selectivity of the subsequent sacrificial-layer etching by, e.g. $ClF_3$. In this context, it is particularly advantageous when the Ge level of the sacrificial SiGe layer is selected to be so small, that no Ge or only a little Ge is incorporated into the thermally grown oxide as foreign atoms and a more or less pure silicon oxide is formed on the sacrificial SiGe layer. This may be achieved by selecting the Ge level to be, for example, less than 50 atom %. A silicon oxide having an insignificantly low Ge level constitutes a particularly effective diffusion barrier for Ge.

Figure 1B:
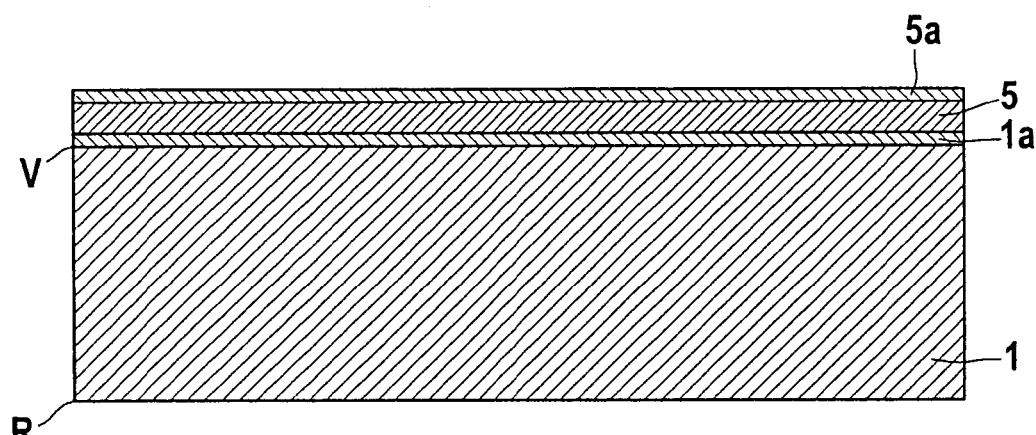
Figure 1C:
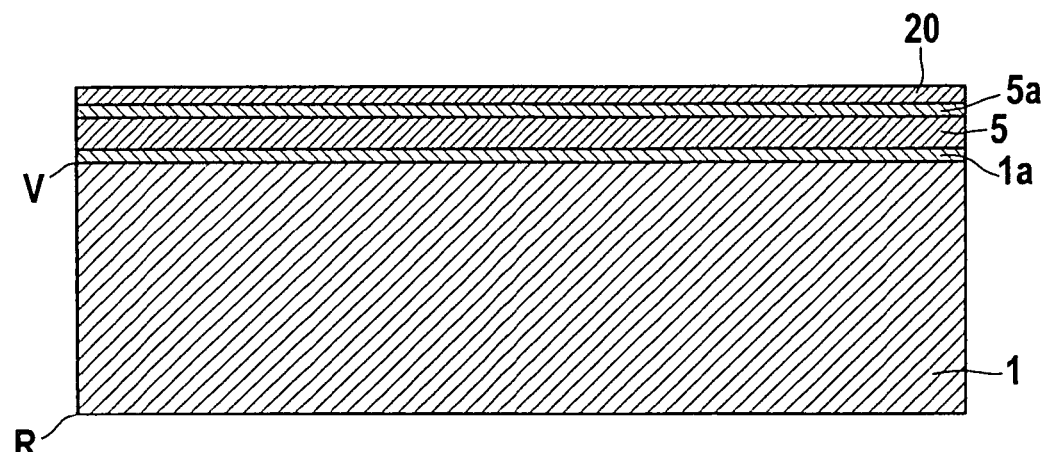
Figure 1D:
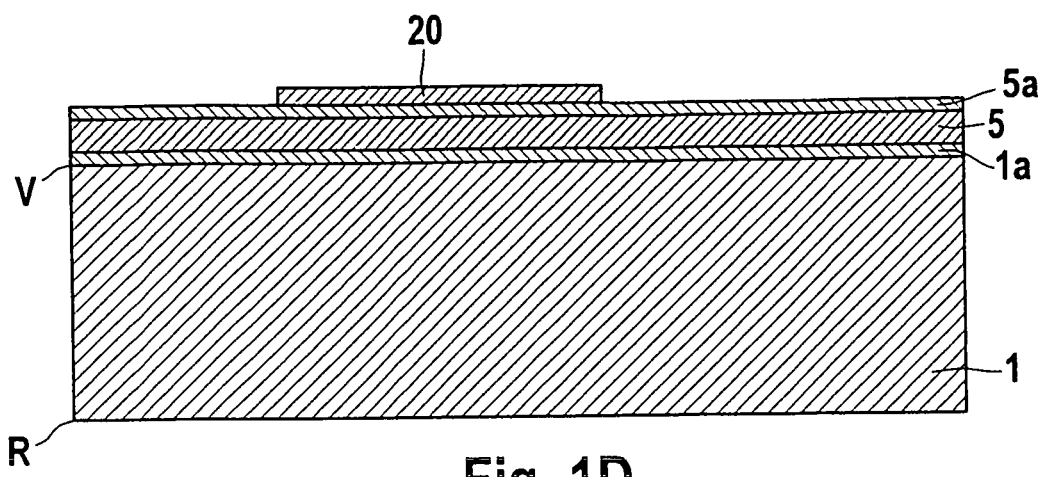
Figure 1E:
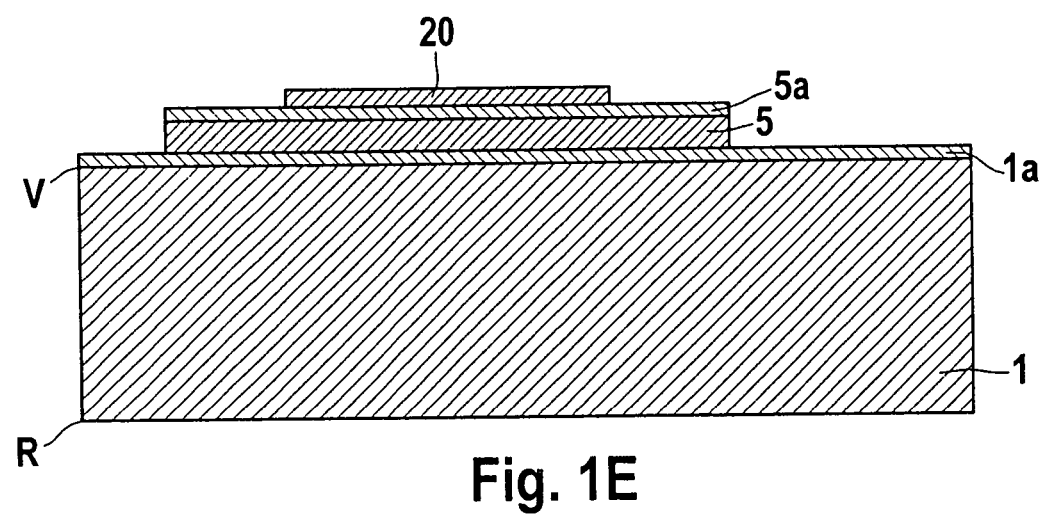

According to FIG. 1C, a polysilicon layer 20 is then deposited over SiGe oxide layer 5a. According to FIG. 1D, polysilicon layer 20 is subsequently patterned into the shape of an island, using a photolithographic technique.

Then, sacrificial layer 5 and SiGe oxide layer 5a on it are likewise patterned in the shape of an island, using an additional photolithographic process step, the lateral dimensions of these islands being greater than the one of patterned polysilicon layer 20. The same photomask, but two different etching steps, are used for patterning layers 5, 5a, the first etching step being used for etching through SiGe oxide layer 5a and stopping on sacrificial SiGe layer 5, and the second etching step being used for etching through sacrificial SiGe layer 5 and stopping on subjacent oxide layer 1a. The two etching steps are preferably plasma-etching steps. This leads to the process state shown in FIG. 1E.

Figure 1F:
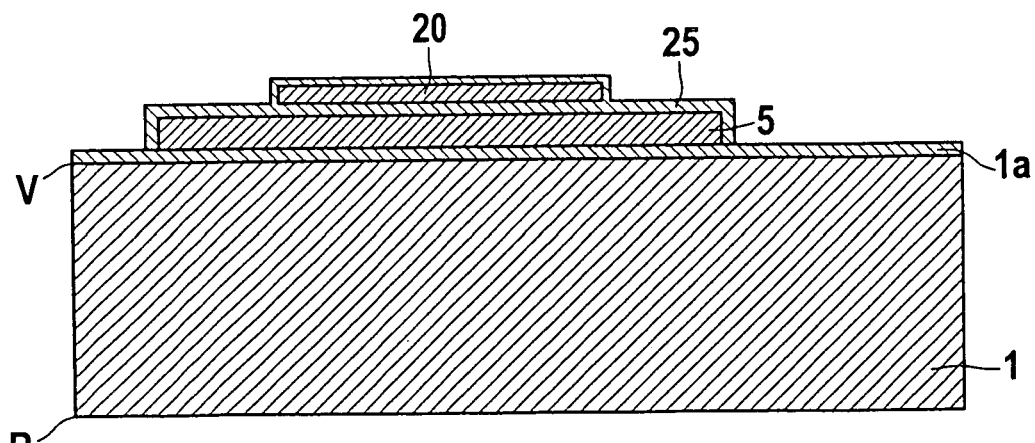

According to FIG. 1F, the structure is subsequently annealed and oxidized for a short time in the process, e.g. 10 minutes to 1 hour long at 900° C. to 1000° C., in order to form an oxide layer 25 on sacrificial layer 5 and polysilicon layer 20. The annealing is also in the interest of mechanical layer properties, i.e. of reducing stress and stress gradients. Oxide layer 25 grows more rapidly on the SiGe of sacrificial layer 5 than on the germanium-free polysilicon of polysilicon layer 20. The reason for this is that the germanium level in the SiGe markedly increases the oxide growth rate over germanium-free silicon, namely by a factor of 1.5 to 5. At this point, e.g. the function of the above-described diffusion barrier between the sacrificial SiGe layer and the superjacent polysilicon of the diaphragm is needed, in order to prevent interdiffusion of Ge atoms from the SiGe into the polysilicon at the high temperature of the annealing and oxidation. In addition, along the lines of preventing future Ge interdiffusion, it is in turn advantageous for a substantially Ge-free silicon oxide to also grow on the SiGe sacrificial-layer material during this second oxidation process, which may be achieved in the case of a Ge level of, e.g. <50% in the SiGe layer.

Figure 1G:
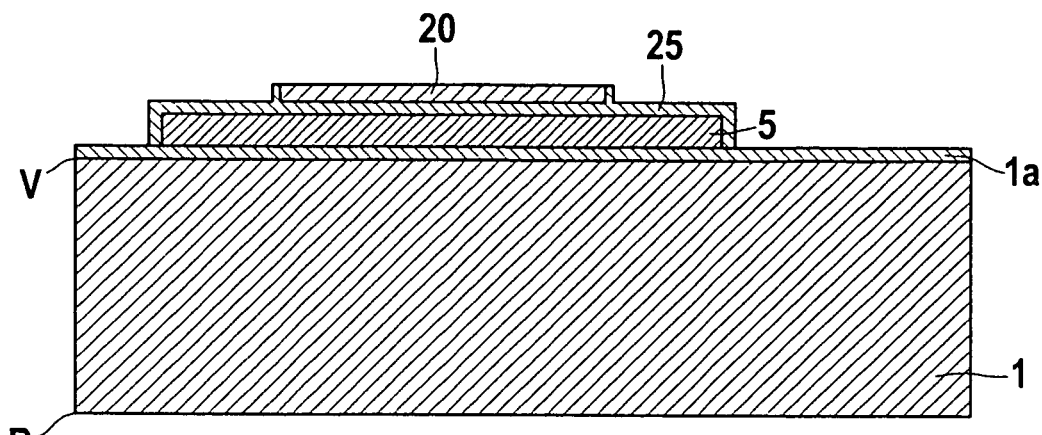

According to FIG. 1G, oxide layer 25 is subsequently etched back, preferably in an oxide plasma-etching process, which stops or nearly stops on the silicon of layer 20. The advantage of such a plasma-etching process is that the oxide-etching rate is less of a function of the content of the oxide, i.e. it is particularly of no consequence if a little germanium is dissolved in the oxide or not. As was explained above, the oxide advantageously contains no Ge or only very little Ge. Thus, one obtains an oxide-free surface of polysilicon layer 20, surrounded by a slightly thinned oxide layer 25 that is based on the SiGe of sacrificial layer 5.

Figure 1H:
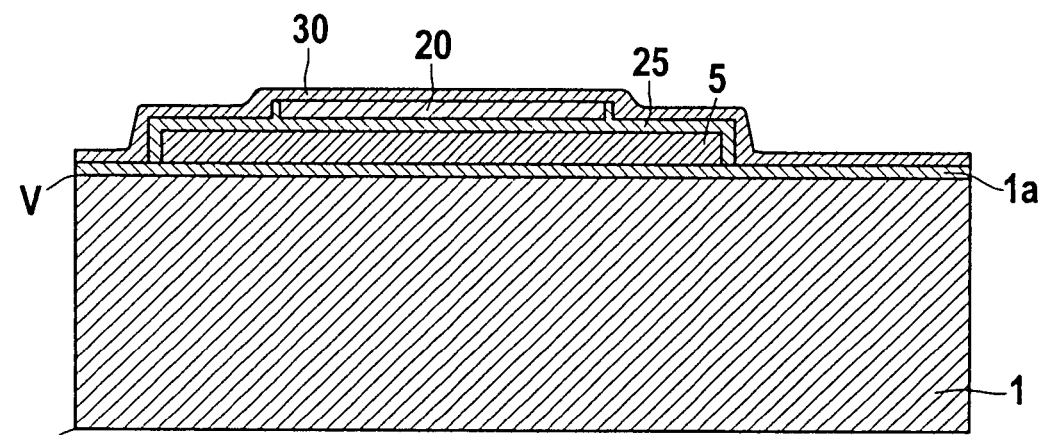
Figure 1I:
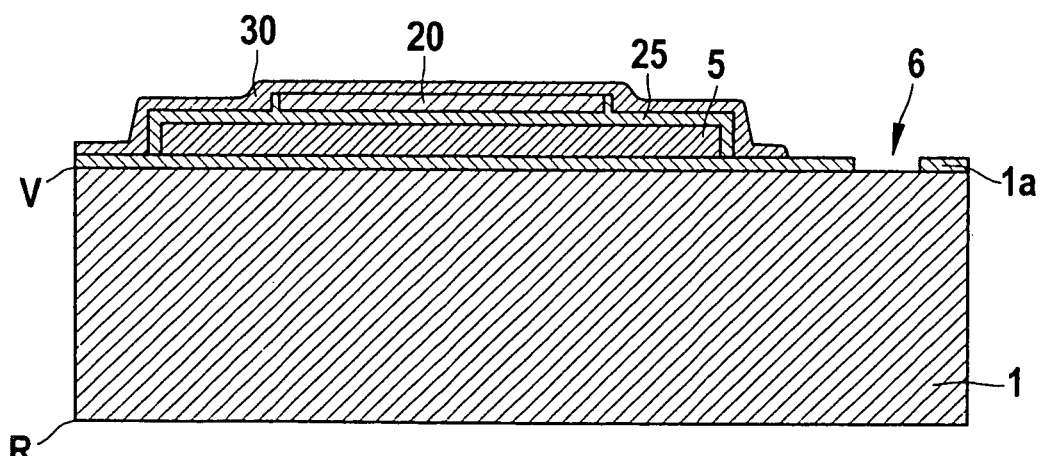

According to FIG. 1H, the pattern is covered with an additional polysilicon layer 30, which is patterned according to FIG. 1I, according to which a window 6 is formed in oxide layer 1a for exposing the wafer front side of silicon-wafer substrate 1.

Figure 1J:
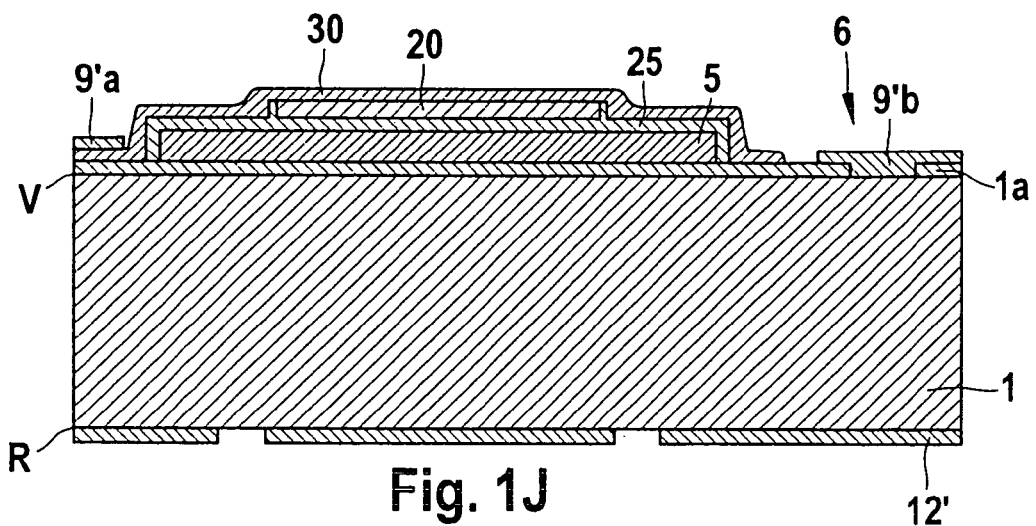

According to FIG. 1J, a conductive metallic layer is deposited on the front side and patterned in such a manner, that it is no longer present in the diaphragm region, but only contacts conductive polysilicon layer 20 outside of the diaphragm region in region 9'a, and contacts silicon-wafer substrate 1 through window 6 in region 9'b. In addition, a masking layer 12' made of thick photoresist, for example 5-10 μm thick, or made of a thick oxide layer, is formed on back side R of the wafer for the subsequent trenching process.

Figure 1K:
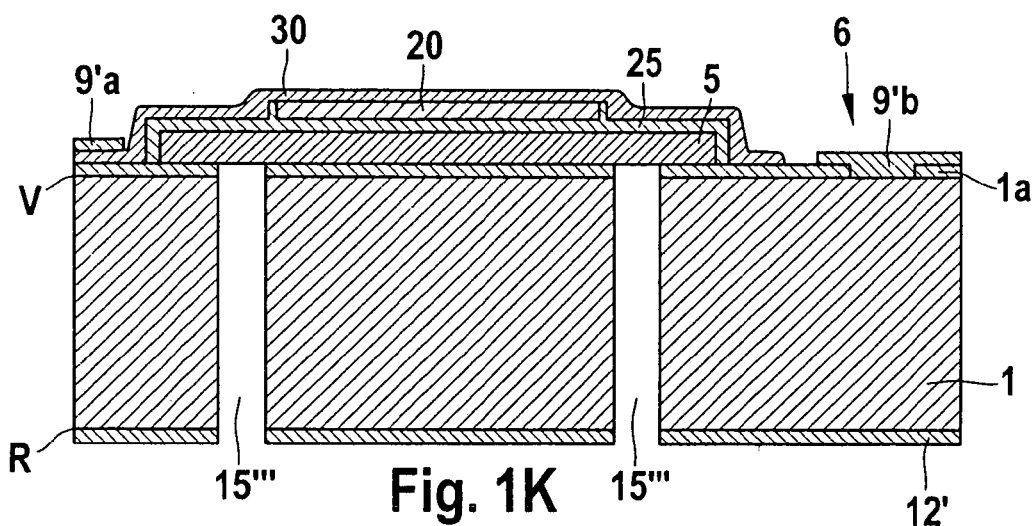

With reference to FIG. 1K, a single-stage, deep-etching process is then carried out for the purpose of trenching, a perforation hole or a plurality of perforation holes 15''' being produced from back side R of the wafer to front side V of the wafer. The deep-etching process may be a plasma-etching process as described, for example, in DE 4241045 C2. The trenching process stops on oxide layer 1a, which is subsequently etched through in a further oxide-etching step that stops, in turn, at sacrificial layer 5.

Figure 1L:
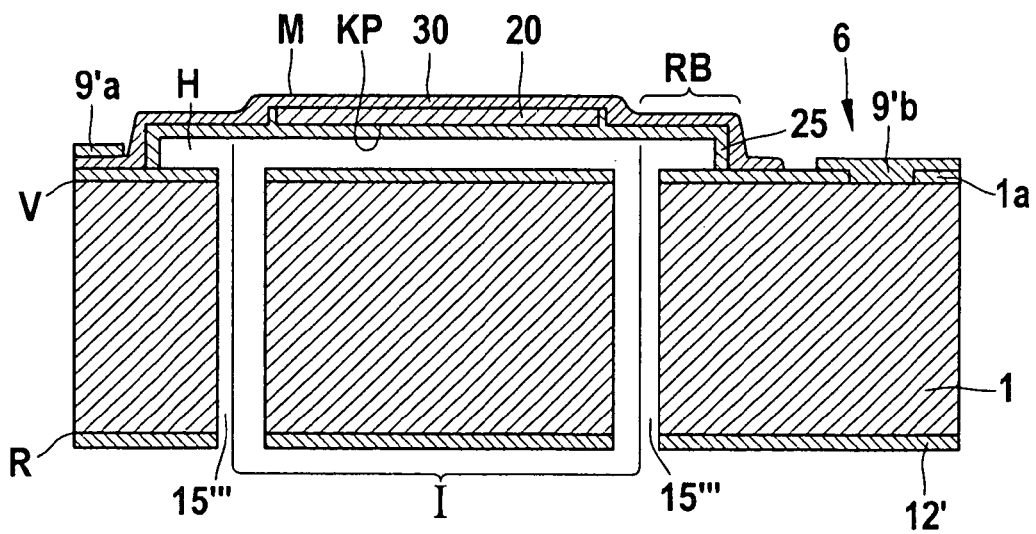

According to FIG. 1L, sacrificial SiGe layer 5 is finally selectively etched out with the aid of $ClF_3$ sacrificial-layer etching technology to expose diaphragm M. Depending on the requirement, oxide layers 1a, 25 still remaining may be removed under diaphragm M, using HF-vapor etching.

This produces a relative-pressure sensor between diaphragm M and silicon substrate 1, the relative-pressure sensor being able to be evaluated capacitively, and polysilicon region 20 increasing the thickness of inner region I of diaphragm M and stiffening it in comparison with edge region RB of the diaphragm, and therefore, the inner region of the diaphragm is less curved than in the case of the known design approaches. Accordingly, the theoretical nonlinearity is reduced by reducing the diaphragm bending of deflectable capacitor plate KP.

As a variation of the present specific embodiment, it is possible to provide a lower polysilicon electrode as a counterelectrode in place of the substrate, the lower polysilicon electrode being able to be buried and contacted under the diaphragm. This means higher process costs, but the advantage, for example, that the surface of the counterelectrode may be geometrically limited to the inner region of the diaphragm, namely where it is stiffened by its thickness. In addition, this reduces the parasitic capacitances. In place of back-side trench patterning, a further modification of this variant allows the diaphragm to be patterned from the front side of the wafer, so that etching openings are formed in the diaphragm, through which, in turn, selective sacrificial-layer etching of sacrificial SiGe layer 5 may be carried out with the aid of the etching gas $ClF_3$. After completion of the sacrificial-layer etching, these etching openings may be closed again by deposition processes, e.g. PECVD processes, which means that a defined reference pressure is enclosed in the formed cavity under the diaphragm. This obviously forms an absolute-pressure sensor for the application of pressure from the front side. The advantage of the SiGe sacrificial-layer technology is, in turn, that selective $ClF_3$-etching of SiGe over Si is possible without having to increase the process costs for passivating functional silicon. And, in contrast to HF-vapor etching technology, functional oxides, such as the isolation oxide, remain. At this point, it should be noted that where applicable, HF-vapor etching steps for removing the thin oxides under the diaphragm according to the present invention only take up a small amount of time and therefore do not affect, or only slightly affect, the layer construction at other positions.

FIGS. 2A-L show schematic cross-sectional views of the essential manufacturing steps of a micromechanical component in the form of a capacitive pressure sensor, according to a second specific embodiment of the present invention.

The idea forming the basis of the present, second specific embodiment is to more or less completely decouple the diaphragm part contributing to signal generation, mechanically from the diaphragm as a separate electrode surface, so that no more bending occurs at all in the region of the measured capacitance.

Figure 2A:
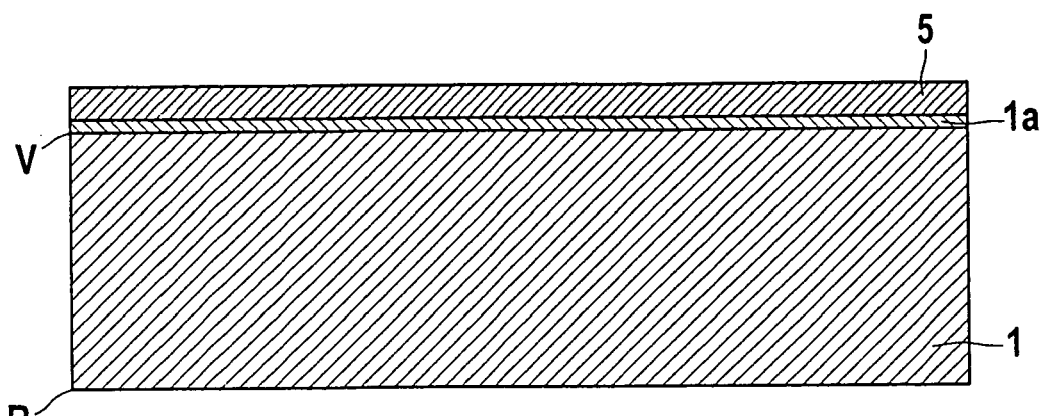
FIGS. 2A-L show schematic cross-sectional views of the essential manufacturing steps of a micromechanical component in the form of a capacitive pressure sensor.
Figure 2B:
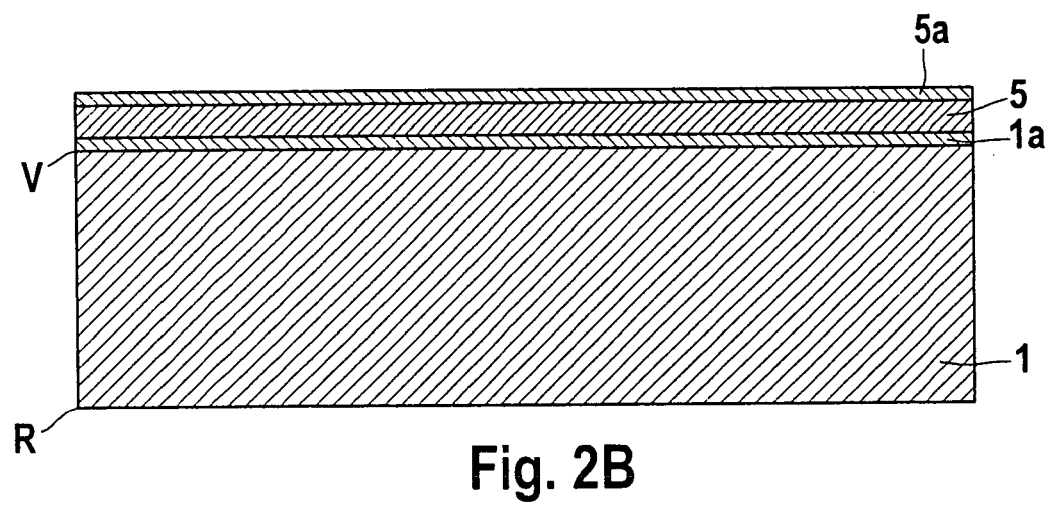
Figure 2C:
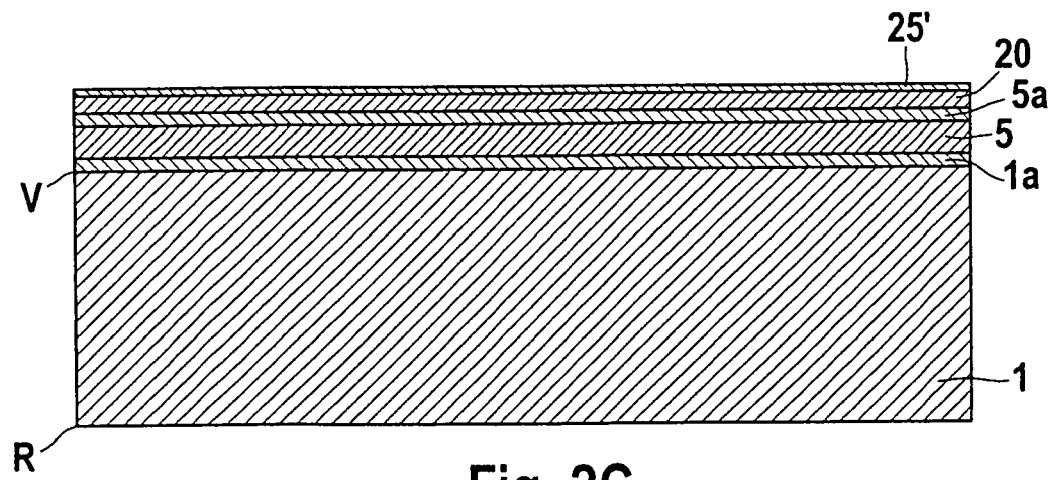

According to FIG. 2A, an oxide layer 1a is deposited or thermally formed on a silicon-wafer substrate 1, and sacrificial SiGe layer 5 having a Ge level of 0.1-0.8, preferably 0.2-0.5, is provided over the oxide layer. With reference to FIG. 1B, the sacrificial SiGe layer is then thermally oxidized in order to form a SiGe oxide layer 5a over it. This SiGe oxide layer again constitutes an etching stop and also a diffusion barrier for Ge and grows in a particularly advantageous manner without the inclusion of foreign Ge atoms, i.e. as substantially pure silicon oxide, when the germanium level in the SiGe is selected to be suitably low, e.g. <50 atom %. A Ge-free or nearly Ge-free silicon-oxide layer constitutes a particularly effective diffusion barrier for Ge. As shown in FIG. 2C, a polysilicon layer 20 is deposited over the entire surface of SiGe oxide layer 5a and subsequently annealed, e.g. at 900° C. to 1000° C. for a period of, for example, 10 minutes to 1 hour, and as shown in FIG. 2C, a thin oxide layer 25' is deposited or thermally grown over it. The latter may occur during the annealing step. The annealing also pursues the objective of improving the mechanical properties of the polysilicon. In this context, it is essential that no Ge interdiffusion into the polysilicon occurs during the high-temperature treatment, which is achieved by the oxide diffusion barrier.

Figure 2D:
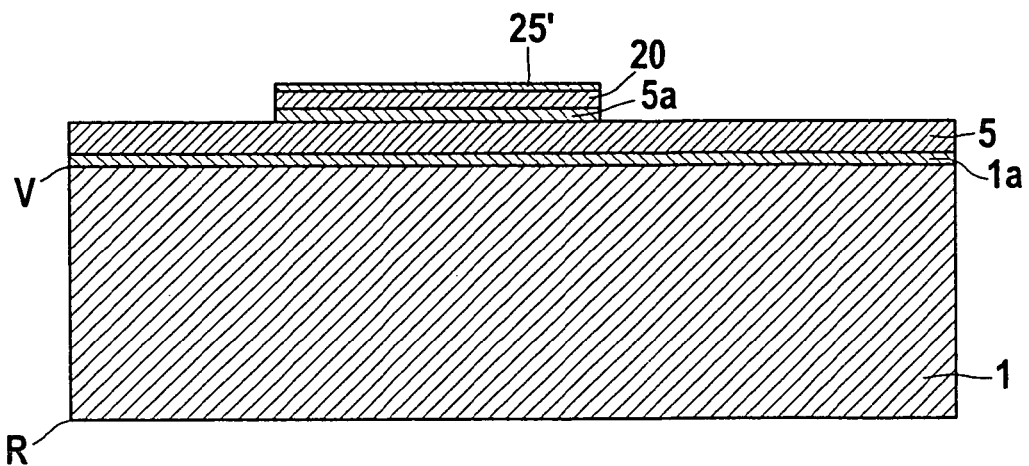

According to FIG. 2D, thin, upper oxide layer 25' is then selectively etched up to polysilicon layer 20 with the aid of a single mask. The oxide etching stops independently on polysilicon layer 20. The etching process is subsequently converted to a selective etching process for polysilicon, by which polysilicon layer 20 is etched through to a stop on subjacent SiGe oxide layer 5a. After the stop on SiGe oxide layer 5a, the etching process is finally reset again to a chemistry, which selectively etches oxide and stops on subjacent sacrificial SiGe layer 5. Plasma-etching processes are advantageously used for this, since they may easily be set up for both selectively etching oxide over Si or SiGe or selectively etching Si or SiGe over oxide, by selecting the appropriate gases. In the case of selective oxide etching, process gases such as $CHF_3$, $CF_4$ and $CHF_3$, $C_4F_8+CF_4$, etc. are used. The process described in DE 4241045 C2 may be advantageously used for selectively etching Si or SiGe. In this context, it is possible to execute these steps in succession or in one and the same plasma-etching system. When a shift is made from oxide to polysilicon or back to oxide etching, only the process gases are changed around. In principle, it is even possible to execute these steps in succession without having to unload the wafer from the apparatus between the steps. The etching stops may each be detected with the aid of methods for end-point detection known per se, for example optical emissions spectroscopy on the plasma or laser end-point detection, etc. FIG. 2D shows the result of these three etching steps executed one after the other, preferably using only a single mask.

Figure 2E:
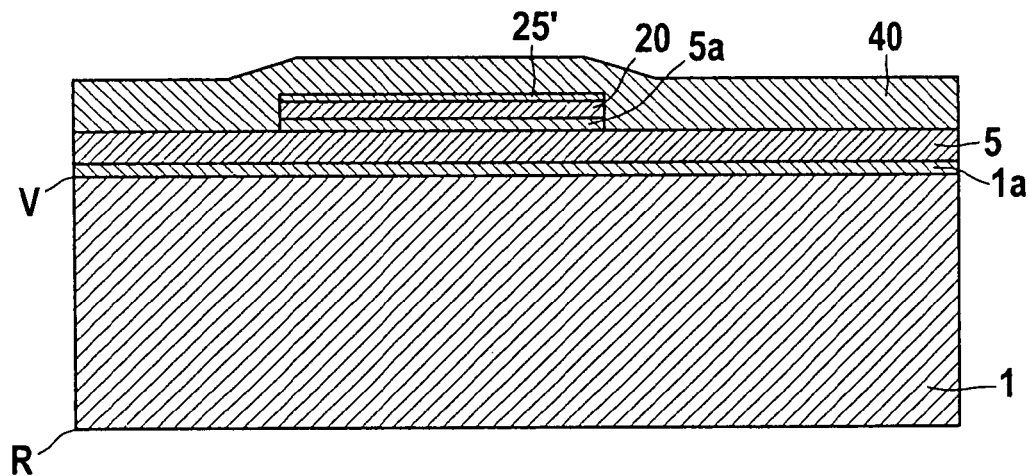
Figure 2F:
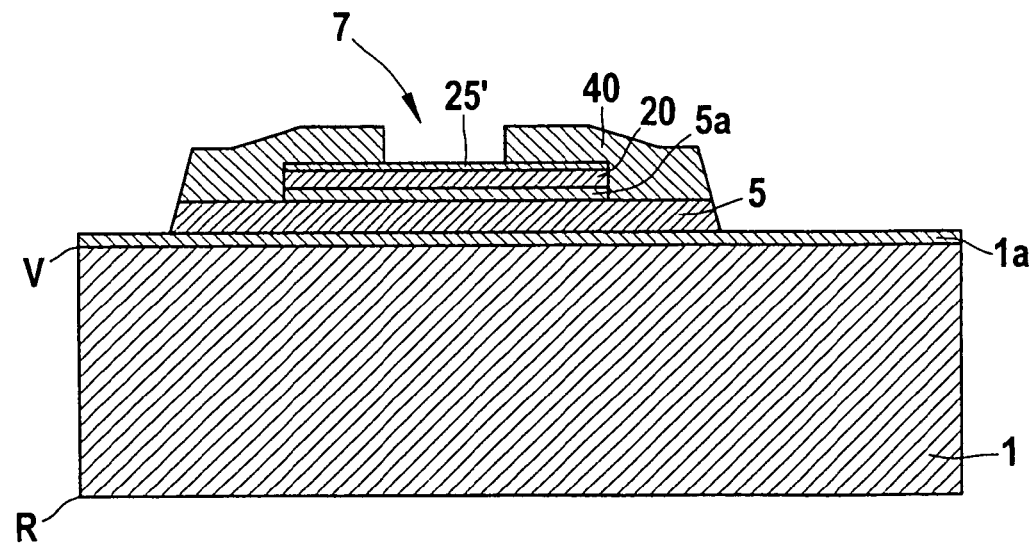

According to FIG. 2E, this layer construction is covered by an additional, sacrificial SiGe layer 40. As shown in FIG. 2F, the pile of layers is then etched through to lowest oxide layer 1a for determining the diaphragm region and providing a window 7 in the diaphragm region, this window 7 extending to oxide layer 25. The plasma-etching process according to DE 4241045 C2 is preferably used for this as well, since it has a very high selectivity with respect to oxide. This means that a very thin oxide in the form of layer 25' is sufficient for stopping the process and allowing sufficiently long overetching on this very thin oxide, as long as the etching has progressed to oxide layer 1a up to outside of the diaphragm region. If thin oxide layer 25' is perforated during this overetching, the buried polysilicon pattern would be destroyed, i.e. etched away, very rapidly, which must always be prevented.

Figure 2G:
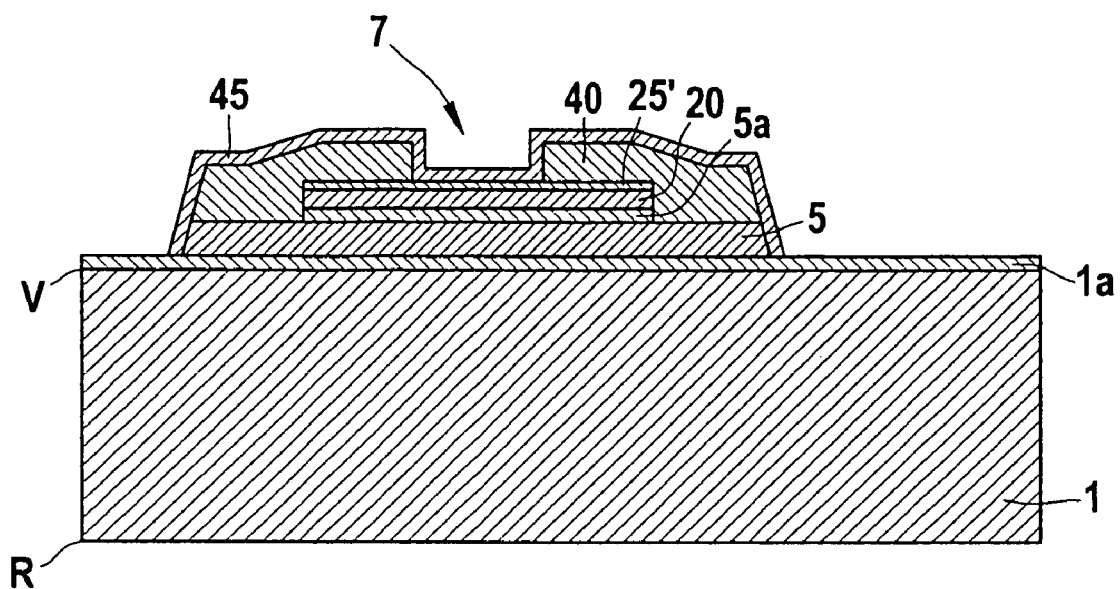

According to FIG. 2G, the pattern obtained in this manner is subjected to further thermal oxidation, in order to form an oxide layer 45 over the diaphragm region. In this connection, it should be taken into consideration that SiGe oxidizes markedly more rapidly than germanium-free silicon, by a factor of 1.5 to 5. Therefore, oxide layer 45 grown during the oxidation is only thin on polysilicon layer 20 and, in comparison, markedly thicker on the open SiGe surfaces of layer 40 or 5. In this context, it is again advantageous when the oxide grown on the SiGe layer does not incorporate any foreign Ge atoms, or only incorporates very few foreign Ge atoms, which may be achieved when the SiGe layer has a sufficiently low Ge level, e.g. <50%. On the other hand, the Ge level should be high enough to reach the growth rate of the oxide on the SiGe material, which corresponds, in practice, to a range of values of 0.2-0.5 or 0.3-0.4 for the Ge level in the SiGe material.

Figure 2H:
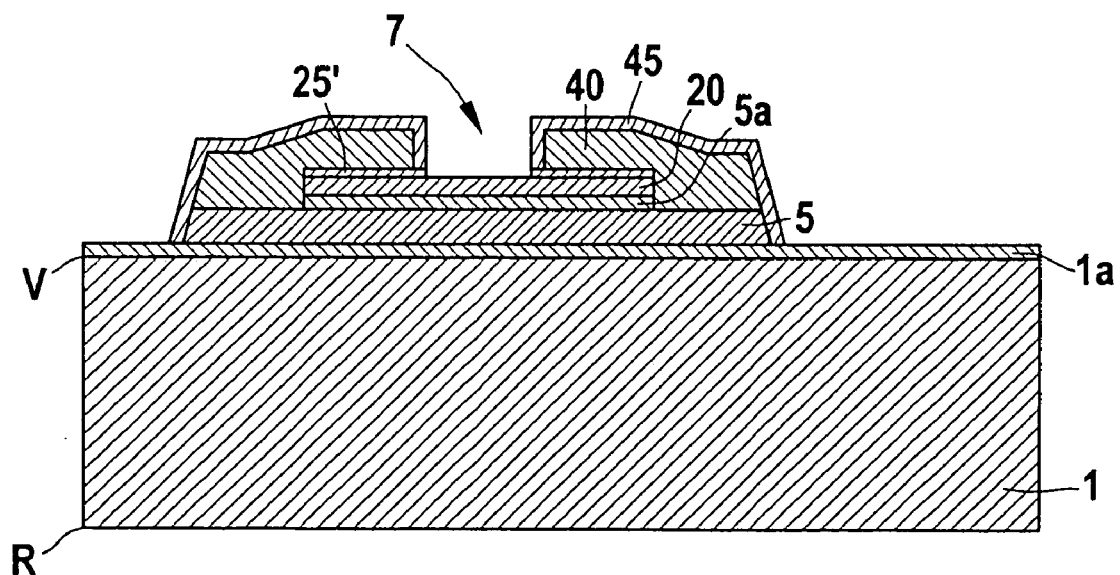

This allows the entire surface of the oxide in window 7 to be etched back without a mask, preferably with the aid of a plasma-etching process for oxide known per se, which selectively stops on polysilicon layer 20 to expose the polysilicon surface in window 7. Since the oxide layer on the SiGe surface is markedly thicker than on the polysilicon surface, it even remains on the SiGe regions in sufficient thickness after the back-etching, as it is still necessary in the subsequent process as a diffusion barrier for germanium. FIG. 2H shows this process state.

Figure 2I:
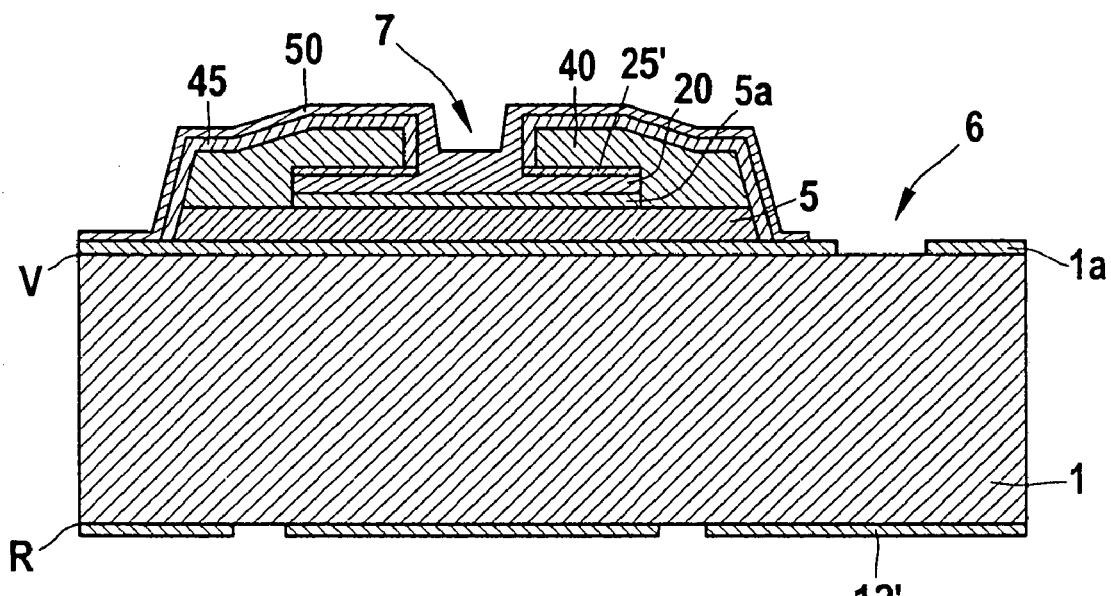

Shown in FIG. 2I is the state, according to which a polysilicon layer 50 has been deposited once more on the entire surface and patterned. In addition, window 6 for exposing and contacting silicon-wafer substrate 1 is shown on the right side. In addition, masking layer 12' of thick photoresist or oxide was deposited on the back side for the subsequent trenching process.

Figure 2J:
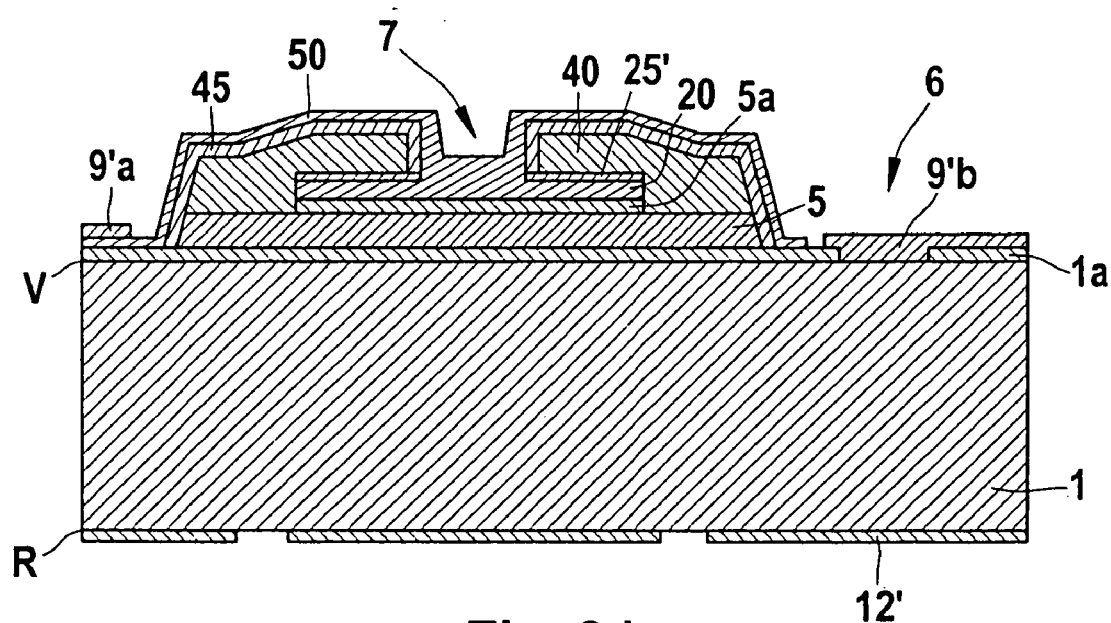

According to FIG. 2J, the electrically conductive layer, preferably of a contact metal such as aluminum or AlCu or AlSiCu, is deposited and patterned in regions 9'a, 9'b for contacting polysilicon layer 50 on the left side of FIG. 2J, and for contacting silicon substrate 1 in window 6 on the right side of FIG. 2J, respectively.

Figure 2K:
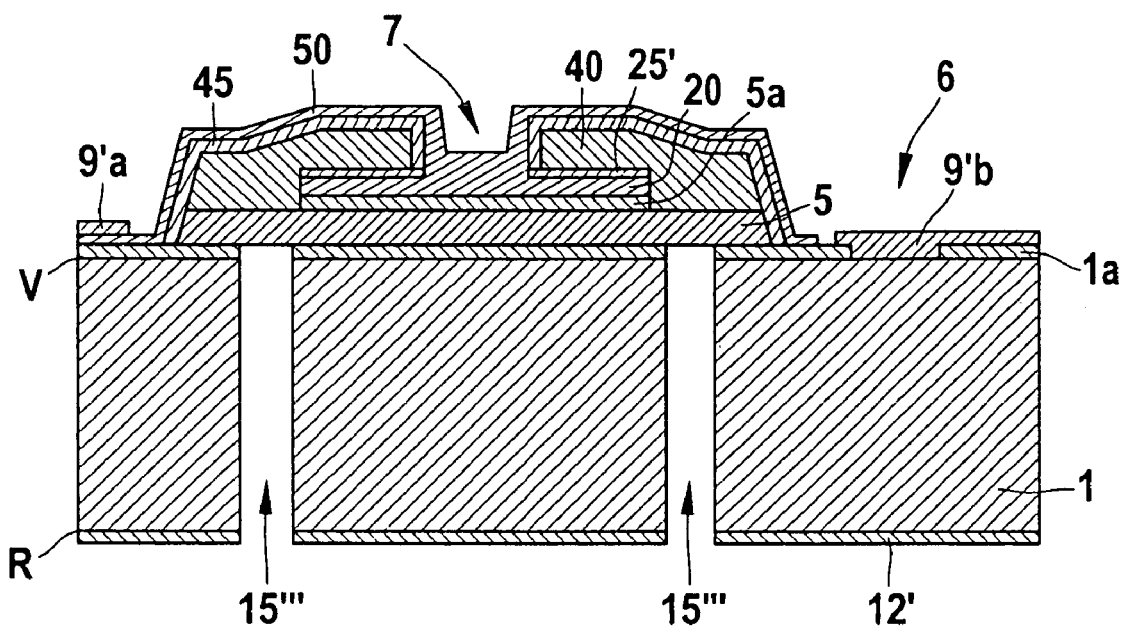

According to FIG. 2K, the trench-etching process then takes place from back side R of the wafer, the trench-etching process initially stopping on oxide layer 1a and, after its perforation, being continued up to sacrificial layer 5 in a further etching process. A plasma-etching process based on process gases, such as $CHF_3$, $C_4F_8$, $CF_4$, $C_3F_8$, etc., or mixtures of the same, is also used for this, since in this manner, it is possible to selectively etch through the oxide and stop on the SiGe. In addition, this plasma-etching step may be executed, in principle, in the same apparatus as the trench-etching step. As long as suitable end-point detection is present, the two patterning steps may even be executed in direct succession, and without reloading the wafer, in one and the same apparatus, or in separate chambers of one and the same apparatus, which saves time and reduces costs.

Figure 2L:
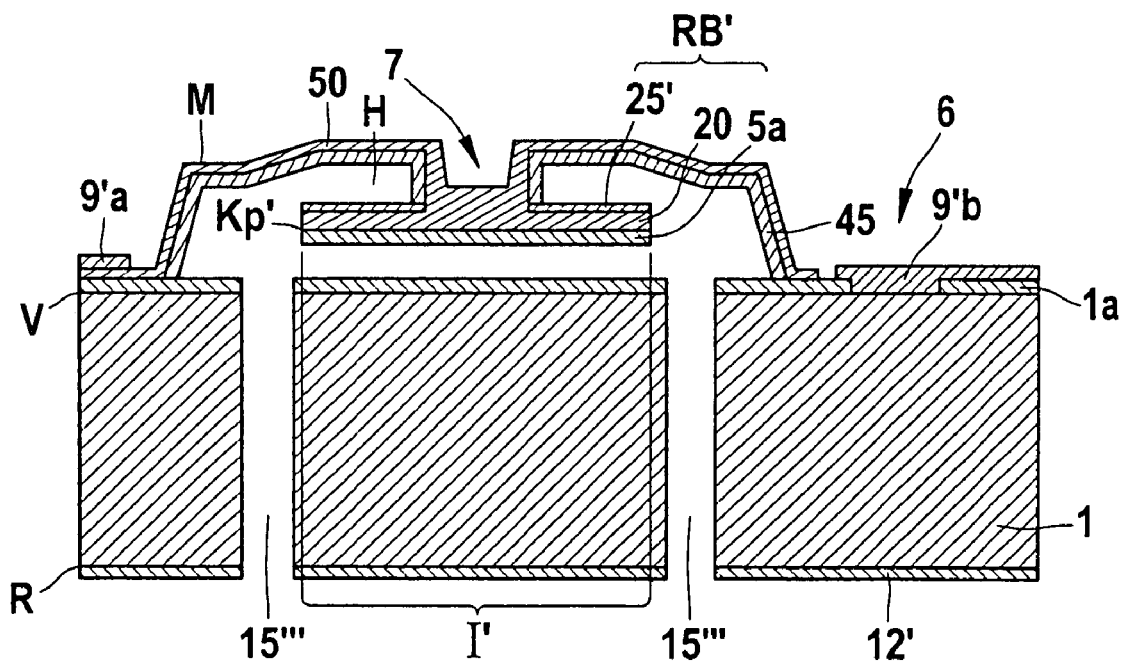

According to FIG. 2L, sacrificial layer 5 and sacrificial layer 40 are finally selectively removed by $ClF_3$ sacrificial-layer etching, in order to expose diaphragm M and subjacent hollow space H. In this case, it is likewise possible to remove oxide layers 1a, 5a, 25', 45 remaining in the diaphragm region with the aid of HF-vapor etching, which only takes up a short period of time and only slightly attacks other oxide layers due to the short exposure time.

The lower polysilicon pattern in inner region I' of diaphragm M now acts as capacitor plate KP', which is mechanically decoupled from possible bending of diaphragm M but electrically coupled to it. The curve of the reciprocal capacitance of the capacitor formed by the diaphragm and the lower counterelectrode is strictly proportional to the pressure, without nonlinearity being present and without the requirement for otherwise necessary correction of this nonlinearity. In this context, edge region RB' of diaphragm M does not noticeably contribute to the capacitance. Therefore, a linear relative-pressure sensor is obtained as a result.

As a variation of this specific embodiment, it is also possible to produce an absolute-pressure sensor. To this end, a perforation of the diaphragm may be etched in from the front side in place of the back-side trenching process. The production of etching holes, preferably only a few etching holes, allows the process gas $ClF_3$ access to the sacrificial layers during the subsequent sacrificial-layer etching. Due to the wide range, the etching rate, and selectivity of the $ClF_3$ with respect to the SiGe, only a few etching holes are advantageously sufficient for this purpose, e.g. in the regions of the diaphragm where they do not interfere, i.e. where they can have as little a mechanical effect as possible on the diaphragm behavior. These preferred locations for the etching openings are, for example, places having particularly low mechanical stress when the diaphragm is acted upon by a pressure, e.g. near the center of the diaphragm or especially at the points of inflection of the bending line of the deflected diaphragm (stress-reversal points approximately ¼ of the diaphragm diameter away from the edge of the diaphragm).

After completion of the sacrificial-layer etching, these etching openings are hermetically sealed by, e.g. a CVD method, a defined referenced pressure also being able to be enclosed in the cavity under diaphragm M by selecting appropriate process conditions during the CVD deposition. Thus, the SiGe sacrificial-layer technique allows the manufacture of a relatively complex pattern having a freely suspended capacitor plate on pressure-sensitive diaphragm M, the freely suspended capacitor plate not bending when diaphragm M itself bends, which consequently renders possible a capacitive absolute-pressure sensor having high linearity, as well.

In the same way, it is possible, as a variation of the above-described procedure, to additionally provide a lower polysilicon electrode under the diaphragm or under the polysilicon plate on the diaphragm, the lower polysilicon electrode being able to be buried in the diaphragm region, and being able to be metal-plated and contacted on the front side. In place of the substrate as a lower counterelectrode, this lower polysilicon electrode may then be advantageously used as a lower counterelectrode for evaluating capacitance. This measure increases the process-side outlay, but in return for this, one advantageously has the option of limiting the lower counterelectrode to the surface of the upper polysilicon plate on the diaphragm. When the surfaces of the lower counterelectrode and the upper polysilicon plate are matched and adjusted to each other, the contributions of edge regions of the diaphragm to the measured capacitance may be even further reduced or completely eliminated, which even further reduces or eliminates the nonlinearity of the reciprocal capacitance curve of the measuring cell resulting from these edge regions.

Although the present invention has been described above with reference to preferred exemplary embodiments, it is not limited thereto but rather is modifiable in many ways.

In particular, the order of individual process steps may be changed without deviating from the subject matter of the present invention. Thus, e.g. the processing of the back side of the wafer may take place before the processing of the front side of the wafer or may be completed in itself, or the processing of the front side of the wafer may take place first or be completed in itself, and the processing of the back side of the wafer may subsequently take place. However, individual process steps may successively alternate with each other on the front side of the wafer and on the back side of the wafer in the course of the entire process, as well, i.e. the front side of the wafer is processed one time and then the back side of the wafer again, etc., and in fact, over one or more steps. The above-mentioned process flows are to be regarded as advantageous in many respects, but this is not the only possible process sequence in the sense of the present invention.

What is claimed is:

1. A micromechanical component comprising:
    a substrate (1), of which at least some regions are conductive;
    an elastically deflectable diaphragm (M), of which at least some sections are conductive, and which arches over a front side (V) of the substrate (1) and is electrically insulated from the substrate (1), the diaphragm (M) having an inner region (I; I') and an edge region (RB; RB'); and
    a hollow space (H), which is provided between the substrate (1) and the diaphragm (M);
    the inner region (I; I') having a cross-section that is modified in comparison with the edge region (RB; RB'), whereby bending of the inner region (I; I') is less than that in the case of an identical cross-sectional area,
    wherein the inner region (I') has, in comparison with the edge region (RB'), a region (KP') hanging down into the hollow space (H) in the shape of a piston.

2. The micromechanical component according to claim 1, wherein the inner region (I) is thickened in comparison with the edge region (RB).

3. The micromechanical component according to claim 2, wherein the inner region (I) has an additional layer (20) in comparison with the edge region (RB).

4. The micromechanical component according to claim 1, wherein the hollow space (H) is filled with a medium; and further comprising at least one perforation opening (15''') running under the diaphragm (M) through the substrate (1); wherein the at least one perforation opening (15''') provides access to the hollow space (H) from a back side (R) of the substrate (1), so that a volume of the medium in the hollow space (H) is variable in response to a deflection of the diaphragm (M).

5. The micromechanical component according to claim 2, wherein the hollow space (H) is filled with a medium; and further comprising at least one perforation opening (15''') running under the diaphragm (M) through the substrate (1); wherein the at least one perforation opening (15''') provides access to the hollow space (H) from a back side (R) of the substrate (1), so that a volume of the medium in the hollow space (H) is variable in response to a deflection of the diaphragm (M).

6. The micromechanical component according to claim 3, wherein the hollow space (H) is filled with a medium; and further comprising at least one perforation opening (15''') running under the diaphragm (M) through the substrate (1); wherein the at least one perforation opening (15''') provides access to the hollow space (H) from a back side (R) of the substrate (1), so that a volume of the medium in the hollow space (H) is variable in response to a deflection of the diaphragm (M).

7. A method for manufacturing a micromechanical component, comprising:
    providing a substrate (1), of which at least some regions are conductive;
    producing an elastically deflectable diaphragm (M), of which at least some sections are conductive, and which arches over a front side (V) of the substrate (1) and is electrically insulated from the substrate (1), the diaphragm (M) having an inner region (I; I') and an edge region (RB; RB'); and
    providing a hollow space (H) between the substrate (1) and the diaphragm (M);
    the diaphragm (M) being designed so that the inner region (I; I') has a cross-section that is modified in comparison with the edge region (RB; RB'), whereby bending of the inner region (I; I') is less than in the case of an identical cross-section;
    wherein the diaphragm (M) is preformed over a sacrificial-layer region (5; 5, 40) provided on the substrate (1) by providing a plurality of patterned layers (20, 25, 30; 5a, 20, 25', 45, 50), and the sacrificial-layer region (5; 5, 40) is then selectively removed with respect to the diaphragm (M), using an etching process;
    wherein SiGe having a Ge level of 0.1-0.8 atom % is used as a sacrificial layer (5; 5, 40); and
    wherein ClF$_3$ or ClF$_5$ is used as an etching gas for the sacrificial-layer etching.

8. The manufacturing method according to claim 7, wherein SiGe having a Ge level of 0.2-0.5 is used as a sacrificial layer (5; 5, 40).

9. The manufacturing method according to claim 7, wherein the substrate includes Si, and an oxide layer (1a) is deposited or grown by thermal oxidation between the sacrificial layer and the substrate, as etching stops and diffusion barriers.

10. The manufacturing method according to claim 7, wherein the Ge level in the sacrificial-layer region (5; 5, 40) is selected to be so low, that a thermally grown SiGe oxide layer contains no Ge or essentially no Ge.

11. The manufacturing method according to claim 7, wherein the Ge level in the sacrificial-layer region (5; 5, 40) is selected to be so high that the growth rate of a thermal oxide layer is increased by a factor of 1.5-10 over growth on silicon.

12. The manufacturing method according to claim 7, wherein the Ge level in the sacrificial-layer region (5; 5, 40) is between 0.3 and 0.4 atom %.

13. The manufacturing method according to claim 7, wherein in comparison with the edge region (RB), an additional layer (20) is provided in the inner region (I).

14. A method for manufacturing a micromechanical component, comprising:
  providing a substrate (1), of which at least some regions are conductive;
  producing an elastically deflectable diaphragm (M), of which at least some sections are conductive, and which arches over a front side (V) of the substrate (1) and is electrically insulated from the substrate (1), the diaphragm (M) having an inner region (I; I') and an edge region (RB; RB'); and
  providing a hollow space (H) between the substrate (1) and the diaphragm (M);
  the diaphragm (M) being designed so that the inner region (I; I') has a cross-section that is modified in comparison with the edge region (RB; RB'), whereby bending of the inner region (I; I') is less than in the case of an identical cross-section,
  wherein the diaphragm (M) is preformed over a sacrificial-layer region (5; 5, 40) provided on the substrate (1) by providing a plurality of patterned layers (20, 25, 30; 5a, 20, 25', 45, 50), and the sacrificial-layer region (5; 5, 40) is then selectively removed with respect to the diaphragm (M), using an etching process, and
  wherein in comparison with the edge region (RB'), a region (KP') hanging down into the hollow space (H) in the shape of a piston is provided in the inner region (I').

15. The manufacturing method according to claim 13, wherein the hollow space (H) is filled with a medium; and one or more perforation openings (15''') running under the diaphragm (M) through the substrate (1) are provided; the one or more perforation openings (15''') providing access to the hollow space (H) from a back side (R) of the substrate (1), so that a volume of the medium in the hollow space (H) is variable in response to a deflection of the diaphragm (M).

* * * * *